United States Patent [19]
Gomi et al.

[11] Patent Number: 5,893,743
[45] Date of Patent: Apr. 13, 1999

[54] PROCESS OF FABRICATING SEMICONDUCTOR DEVICE

[75] Inventors: Takayuki Gomi, Tokyo; Hiroaki Ammo, Kanagawa, both of Japan

[73] Assignee: Sony Corporation, Tokyo, Japan

[21] Appl. No.: 08/877,422

[22] Filed: Jun. 17, 1997

[30] Foreign Application Priority Data

Jun. 18, 1996 [JP] Japan ................................. 8-156481

[51] Int. Cl.⁶ ........................................... H01L 21/8228
[52] U.S. Cl. ........................... 438/322; 438/365; 438/371
[58] Field of Search ............................... 438/203, 202, 438/205, 234, 322, 340, 365, 368, 371

[56] References Cited

U.S. PATENT DOCUMENTS

| | | | |
|---|---|---|---|
| 4,898,836 | 2/1990 | Zambrano et al. | 438/322 |
| 5,001,073 | 3/1991 | Huie | 438/207 |
| 5,011,784 | 4/1991 | Ratnahumar | 148/DIG. 9 |
| 5,151,378 | 9/1992 | Ramde | 148/DIG. 11 |

*Primary Examiner*—Tuan H. Nguyen
*Attorney, Agent, or Firm*—Hill & Simpson

[57] ABSTRACT

A process for forming a first bipolar transistor having a single polysilicon structure and a second bipolar transistor having a single polysilicon structure and being of a conducting type opposite to that of the first bipolar transistor on the same substrate. In the process of fabricating a semiconductor device in which a first bipolar transistor having a single polysilicon structure, a second bipolar transistor having a single polysilicon structure and being of a conducting type opposite to that of the first bipolar transistor, and a third bipolar transistor having a double polysilicon structure are provided on the same semiconductor substrate, a base contact portion of the first bipolar transistor and an emitter of the second bipolar transistor are formed in the same step, and an emitter of the first bipolar transistor and base contact portions of the second and third bipolar transistors are formed in the same step.

3 Claims, 11 Drawing Sheets

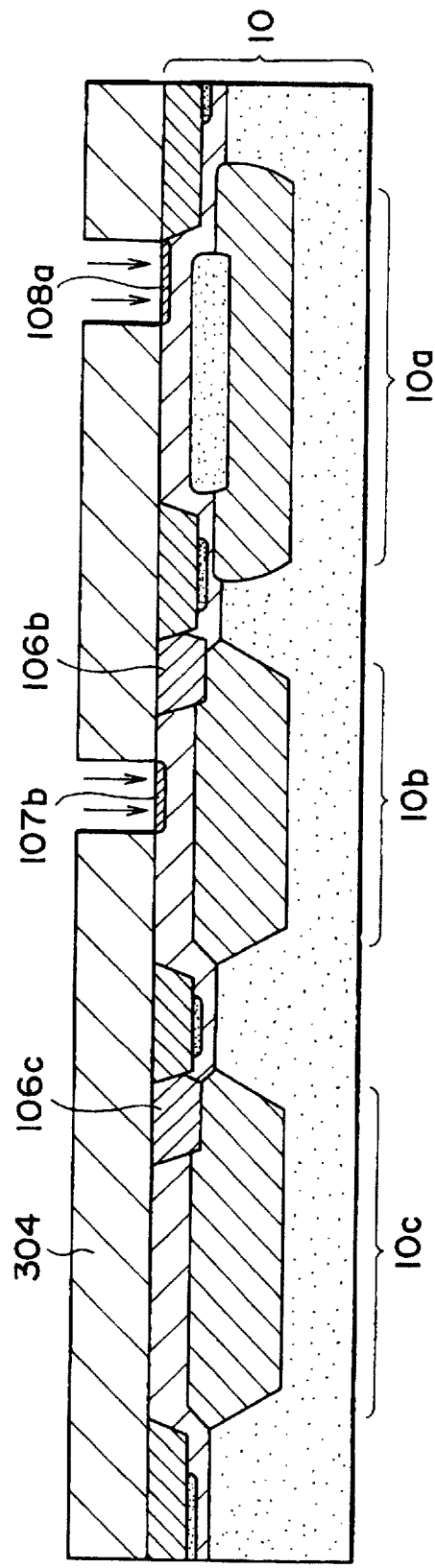
FIG. IA
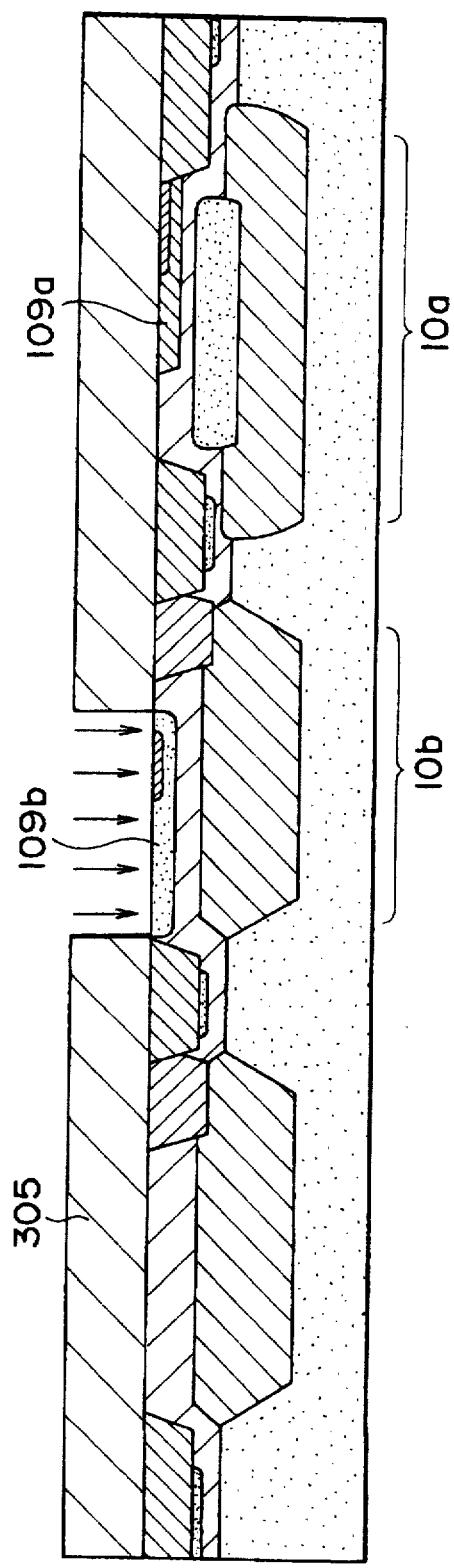
FIG. IB

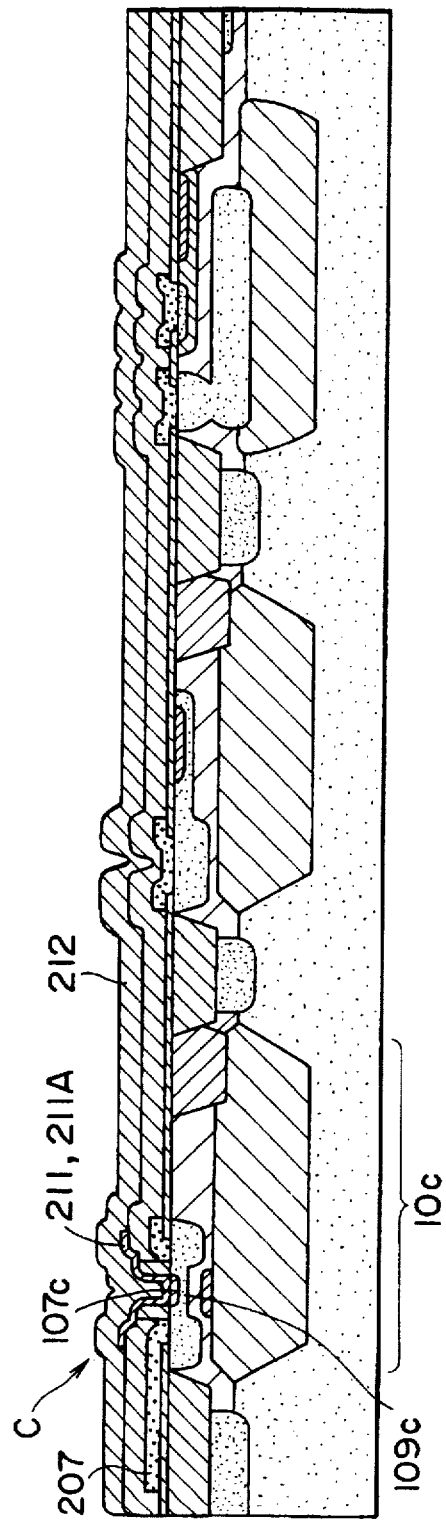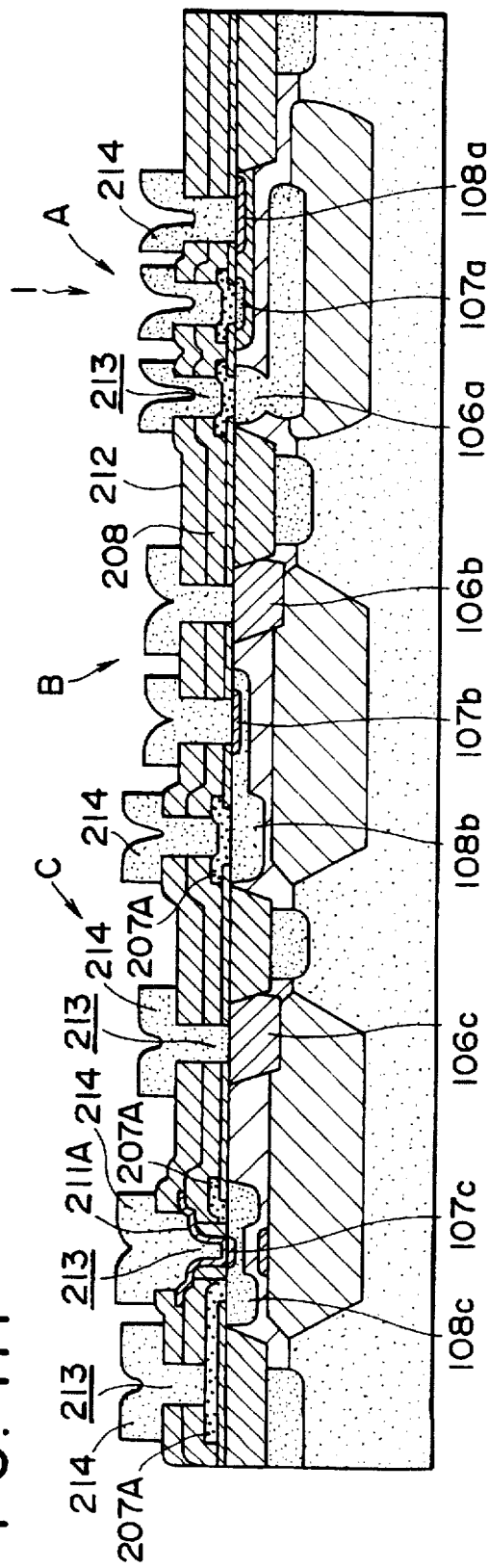

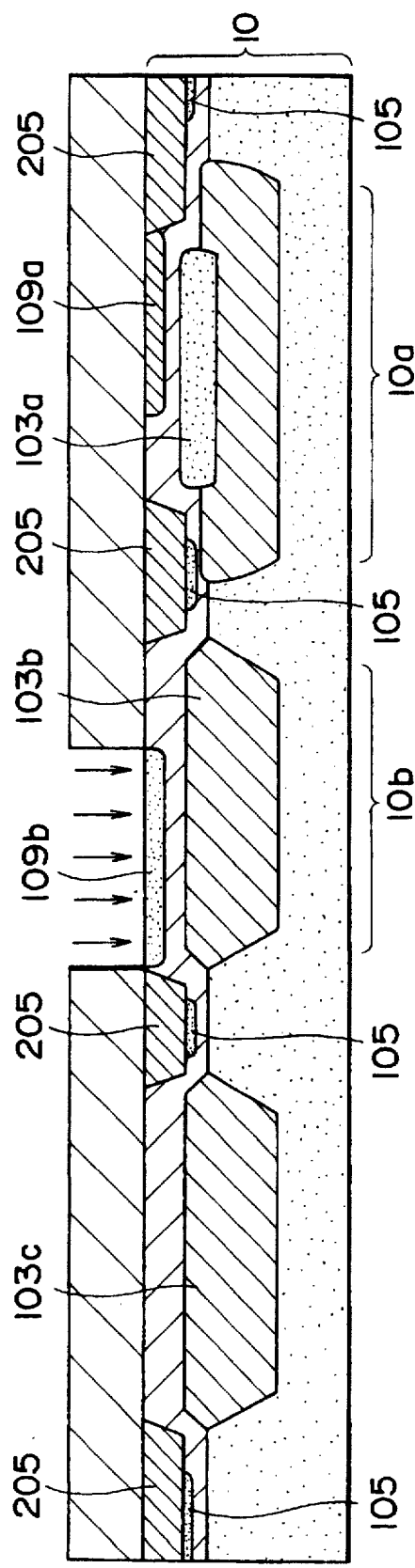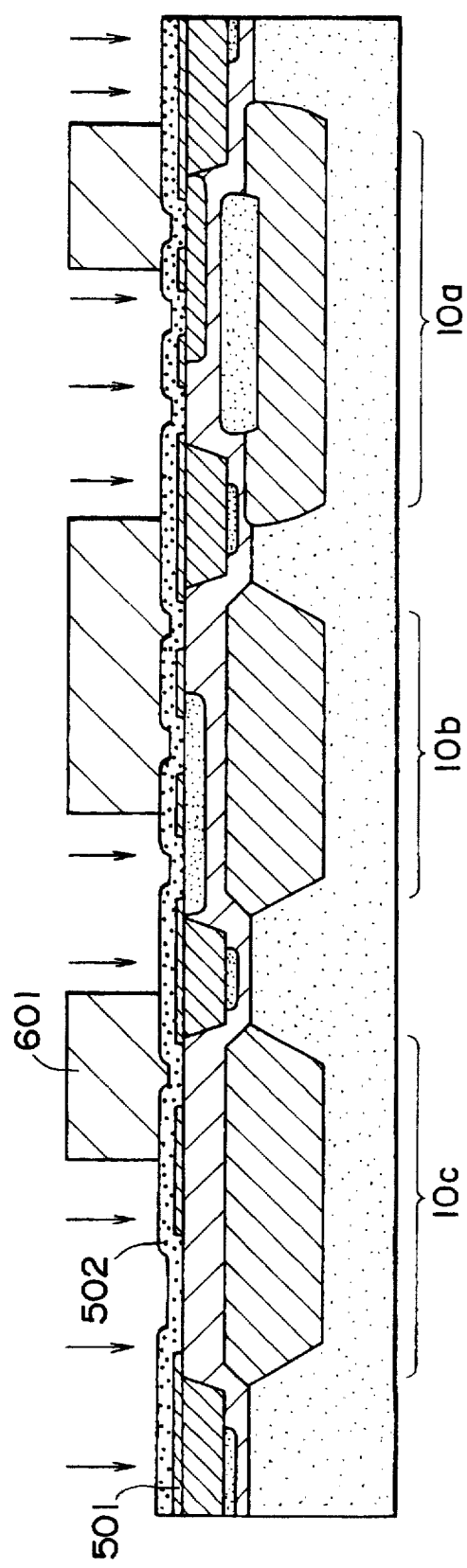

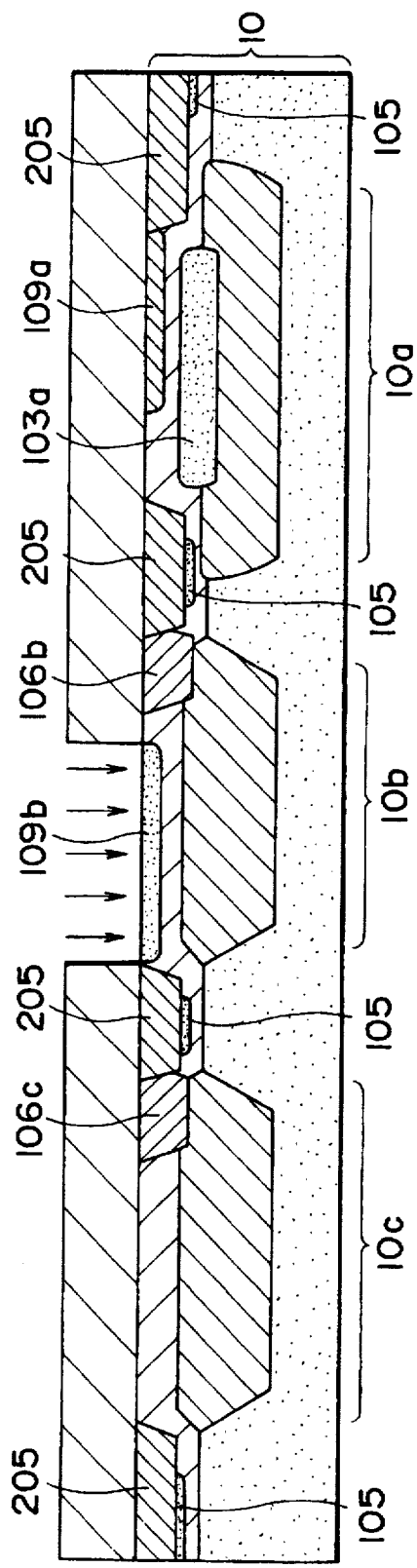
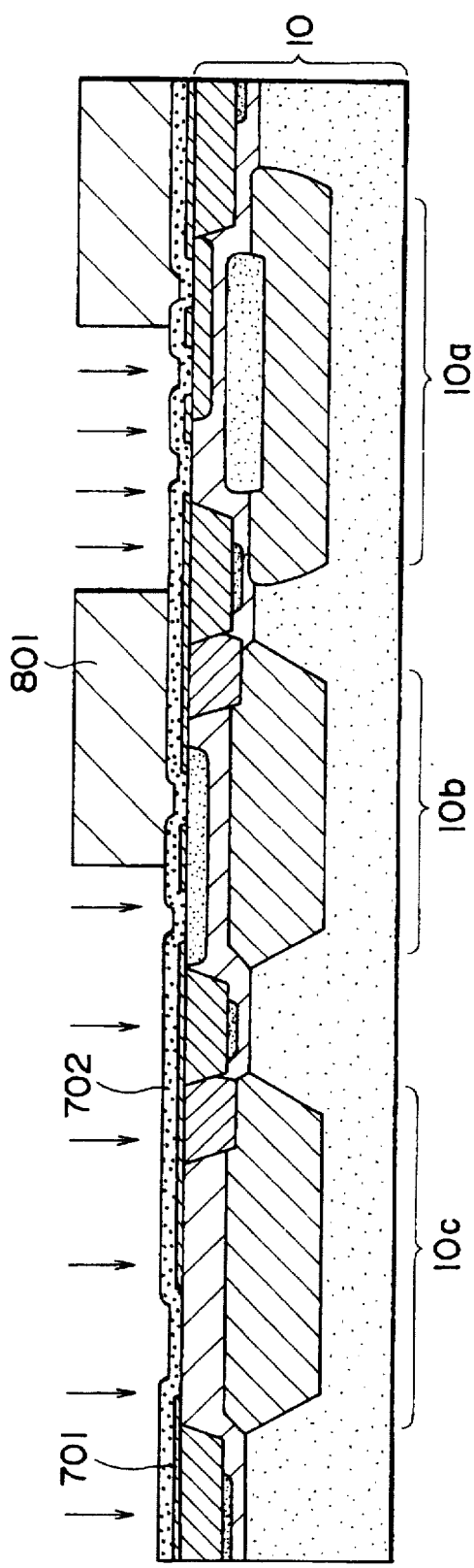
FIG. 3A
FIG. 3B

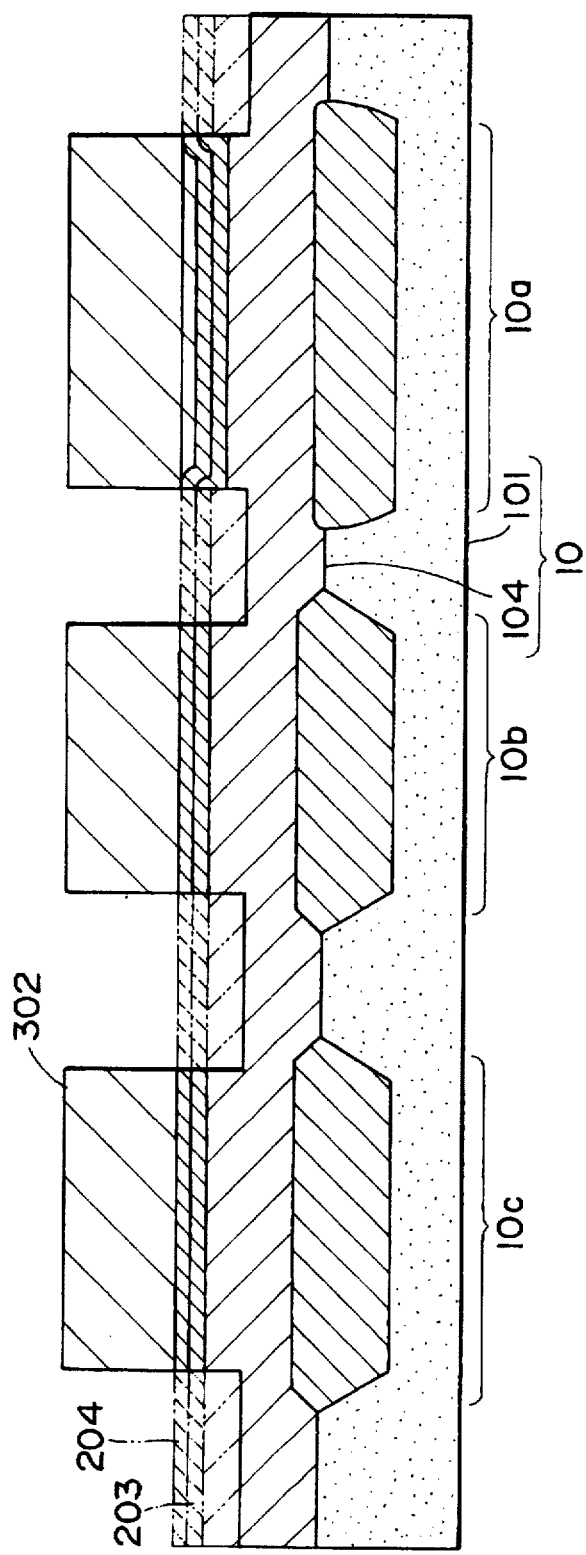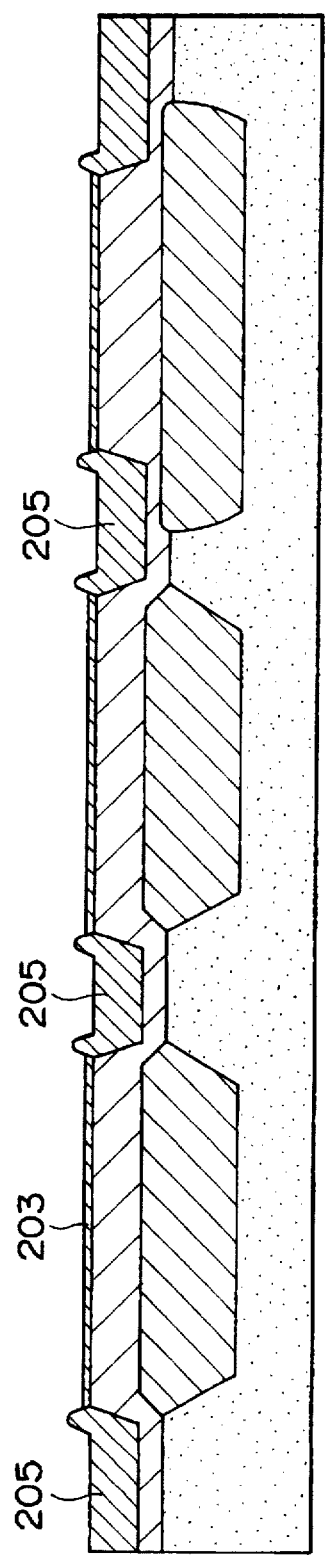

5,893,743

1

PROCESS OF FABRICATING SEMICONDUCTOR DEVICE

BACKGROUND OF THE INVENTION

1. Field of the Invention

The present invention relates generally to a process of fabricating a semiconductor device, and, more particularly, the present invention relates to a process of fabricating a semiconductor device in which bipolar transistors having different conducting types are formed in the same substrate.

2. Description of the Related Art

In a semiconductor device which includes a bipolar transistor circuit, high speed operation of the circuit is achieved by forming the circuit of an NPN bipolar transistor (hereinafter, referred to as the Tr) of a double polysilicon structure capable of making a gap between an emitter and a base contact portion more narrow. The function of such a semiconductor device including the high speed NPN Tr of a double polysilicon structure can be increased by forming a complementary circuit in which a PNP Tr is formed together with the NPN Tr in the same semiconductor substrate. In this case, the PNP Tr is formed of a single polysilicon structure capable of being formed in a reduced number of steps. In the Tr having such a single polysilicon structure, it is possible to ensure the breakdown voltage between the emitter and base by increasing the gap between the emitter and a base contact portion, by making an impurity distribution in the emitter deep, and reducing the concentration of an impurity in a junction between the emitter and the base.

In the manufacturing process sequence for the above referenced semiconductor device, emitters, bases and collectors of the NPN Tr and PNP Tr are formed in individual steps. Incidentally, in the semiconductor device formed of the above complementary circuit, it is necessary to make shallower and higher the profile of the impurity in the base and to make the concentration of an impurity in the emitter higher, for increasing the cut-off frequency of the above NPN Tr. The result is that in such an NPN Tr, the breakdown voltage between the emitter and base becomes lower. However, to satisfy the recent diversified applications of semiconductor devices, there has been a strong demand for a complementary circuit including the above-described NPN Tr and the PNP Tr added with an NPN Tr having a high breakdown voltage.

In order to provide a semiconductor device having the above described complementary circuit, it is necessary to form an NPN Tr of a single polysilicon structure separately from the above NPN Tr of a double polysilicon structure on the semiconductor substrate. That is, in such a semiconductor device, a NPN Tr and a PNP Tr, each having a single polysilicon structure, are disposed together with a high speed NPN Tr on the same semiconductor substrate.

In the case of forming an NPN Tr and a PNP Tr each having a single polysilicon structure on the same semiconductor substrate or in the case where a Tr of a double polysilicon structure are formed together with the above Trs on the same semiconductor substrate, diffusion layers of the Trs are formed in individual steps, with the result that the processing sequence is complicated, leading to the increased cost.

SUMMARY OF THE INVENTION

In a first embodiment of the present invention, in a process of fabricating a semiconductor device, a first bipolar transistor having a single polysilicon structure and a second

2 bipolar transistor having a single polysilicon structure and being of a conducting type opposite to that of the first bipolar transistor are formed on the same semiconductor substrate. A base contact portion of the first bipolar transistor and an emitter of the second bipolar transistor are formed in the same step, and an emitter of the first bipolar transistor and a base contact portion of the second bipolar transistor are formed in the same step.

In the above-described fabrication process, since the base contact portion of the first bipolar transistor and the emitter of the second bipolar transistor are formed in the same step, and the emitter of the first bipolar transistor and the base contact portion of the second bipolar transistor are formed in the same step, it is possible to provide a semiconductor device having a first bipolar transistor and a second bipolar transistor of a conducting type opposite to that of the first bipolar transistor only by adding one step of forming bases and one step of forming collectors to steps of forming bipolar transistors having the same conducting type.

In a second embodiment of the present invention, in a process of fabricating a semiconductor device, a first bipolar transistor having a single polysilicon structure, a second bipolar transistor having a single polysilicon structure and being of a conducting type opposite to that of the first bipolar transistor, and a third bipolar transistor having a double polysilicon structure are formed in the same semiconductor substrate. A base contact portion of the first bipolar transistor and an emitter of the second bipolar transistor are formed in the same step. An emitter of the first bipolar transistor, and base contact portions of the second bipolar transistor and the third bipolar transistor are formed in the same step, and collectors of the second bipolar transistor and the third bipolar transistor are formed in the same step.

In the above-described fabrication process, it is possible to provide a semiconductor device with a bipolar transistor having a single polysilicon structure, a bipolar transistor having a single polysilicon structure and being of a conducting type opposite to that of the first bipolar transistor, and a bipolar transistor having a double polysilicon structure only by adding, to steps of forming two kinds of bipolar transistors. In particular, these are steps of forming a bipolar transistor of a double polysilicon structure and bipolar transistors having a single polysilicon structure and being of the same conducting type, a step of forming bases of the bipolar transistors having the single polysilicon structure.

BRIEF DESCRIPTION OF THE DRAWINGS

FIGS. 1A–1H illustrate a processing sequence of a first embodiment of the present invention;

FIGS. 2A–2D illustrate a processing sequence of a second embodiment of the present invention;

FIGS. 3A–3D illustrate a processing sequence of a third embodiment of the present invention;

FIGS. 4A–4G illustrate a preliminary processing sequence common to the embodiments of the present invention;

DETAILED DESCRIPTION OF THE PREFERRED EMBODIMENTS

In each of the following embodiments of the present invention, a process of fabricating a semiconductor device of a type in which a first bipolar transistor (hereinafter, referred to as the No. 1 Tr), a second bipolar transistor (No. 2 Tr), and a third bipolar transistor (No. 3 Tr) are all formed in the same semiconductor substrate is described.

Here, a PNP bipolar transistor of a single polysilicon structure which is formed in a first region of a semiconductor substrate is taken as the No. 1 Tr; an NPN bipolar transistor of a single polysilicon structure which is formed in a second region of the semiconductor substrate is taken as the No. 2 Tr; and an NPN bipolar transistor of a double polysilicon structure which is formed in a third region of the semiconductor substrate is taken as the No. 3 Tr.

It is to be noted that the bipolar transistor of a single polysilicon structure represents a bipolar transistor including a polysilicon electrode which is entirely formed from a single polysilicon film layer, and the bipolar transistor having a double polysilicon structure represents a bipolar transistor including a polysilicon electrode which is formed from two separate polysilicon film layers.

Figure 4A:
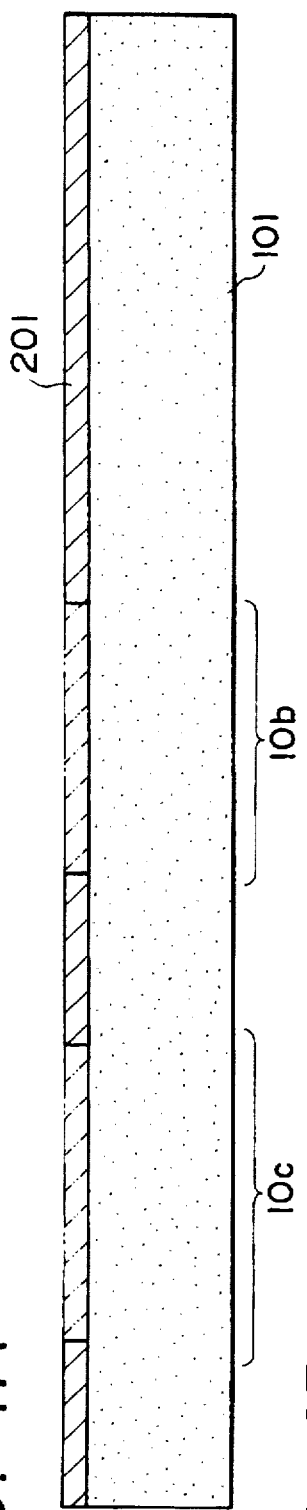

Prior to description of the characteristic processing sequence of each embodiment of the present invention, preliminary processing sequence common to all the embodiments will be described with reference to FIGS. 4A to 4G. As shown in FIG. 4A, a silicon oxide film 201, having a thickness of 330 nm is formed on a silicon substrate 101 made of p-type <111> single crystal silicon by thermal oxidation. The silicon oxide film 201 is partially removed in areas over a second region 10b and a third region 10c of the silicon substrate 101 by etching using a resist pattern (not shown) formed by lithography as a mask, and the resist pattern is then removed.

Figure 4B:
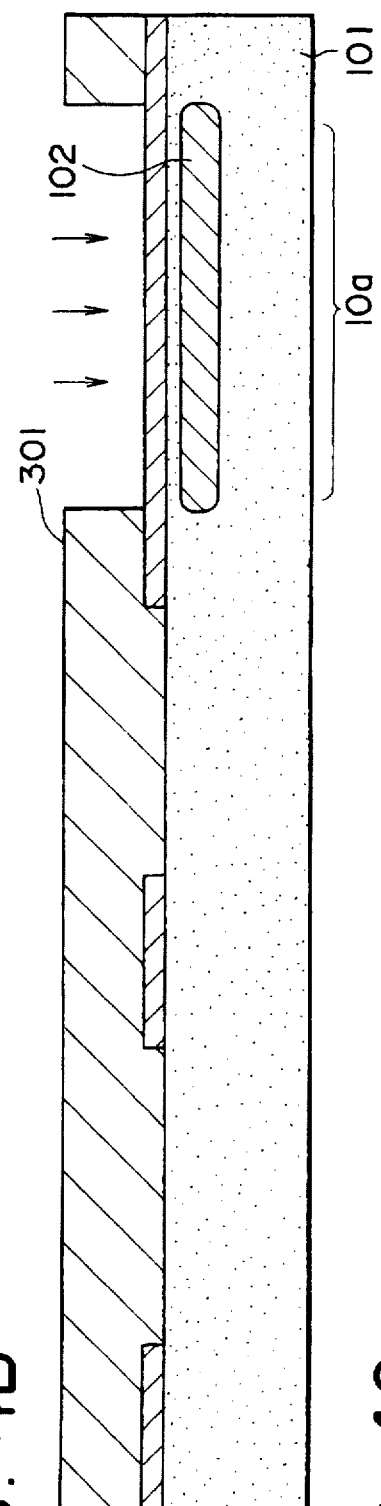

Next, as shown in FIG. 4B, a resist pattern 301 having an opening portion positioned over a first region 10a is formed on the silicon substrate 101, and an N-type impurity is doped in the silicon substrate 101 by ion implantation using the resist pattern 301 as a mask for forming an isolation region 102. Here, ions of phosphorus (P+) as the N-type impurity are doped in a dose of $1\times10^{13}$ to $7\times10^{13}$ ions/cm$^2$, and an implantation energy is set at about 300 to 600 keV in order to introduce the N-type impurity up to the deeper position of the silicon substrate 101.

Figure 4C:
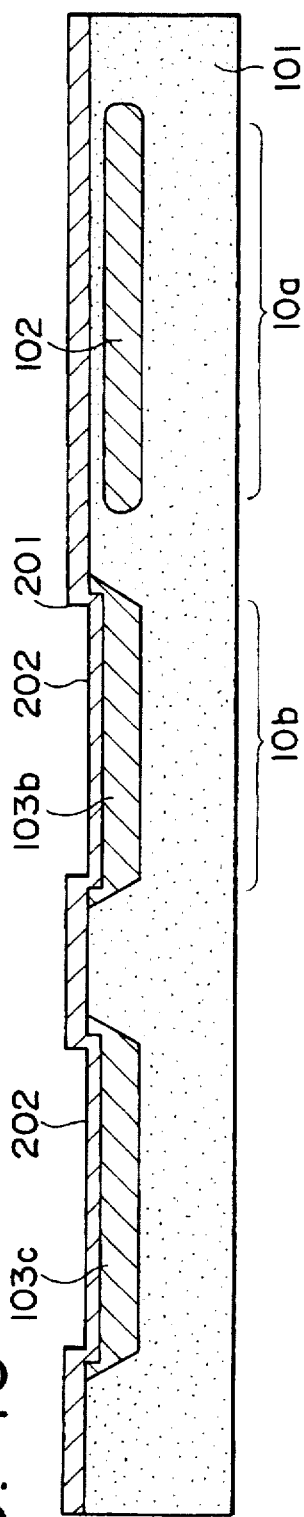

After that, as shown in FIG. 4C, the resist pattern 301 is removed, and buried collectors 103b, 103c are formed in a surface layer of the silicon substrate 101 at the second region 10b and the third region 10c, respectively by vapor-phase diffusion (1200° C., one hour) with antimony oxide (Sb$_2$O$_3$) as a solid diffusion source (not shown). Here, each of the buried collectors 103b, 103c is formed such that the sheet resistance is in a range of 20 to 50 $\Omega/\square$ and the depth is in a range of about 1 to 2 μm. At this time, the silicon substrate 101 is oxidized at a depth of about 50 nm from the exposed surface portion, and a silicon oxide film 202 of about 100 nm in thickness is produced on the exposed surface. Also, the ions of phosphorus (P) implanted in the first region 10a are diffused by this heat treatment, to form the isolation region 102. Since the isolation region 102 is formed at the deep position of the silicon substrate 101, the concentration of the N-type impurity in the surface portion of the first region 10a is suppressed at the low value.

As shown in FIG. 4D, the silicon oxide films 201, 202 on the surface of the silicon substrate 101 are removed by wet etching using hydrofluoric acid. After that, an N-type epitaxial layer 104 having a resistivity of 0.3 to 5 Ω cm is formed on the silicon substrate 101 to a thickness of 0.7 to 2.0 μm by a known epitaxial process, to form a semiconductor substrate 10 composed of the silicon substrate 101 and the epitaxial layer 104.

A silicon oxide film 203 is formed on the surface of the semiconductor substrate 10 to a thickness of about 50 nm by thermal oxidation, and then a silicon nitride film 204 is formed on the upper surface of the silicon oxide film 203 to a thickness of 100 nm by a chemical vapor deposition (CVD) method. The silicon oxide film 203 serves as a buffer film for performing a local oxidation of silicon (LOCOS) process, and the silicon nitride film 204 serves as a mask for performing the LOCOS process. The thicknesses of the silicon oxide film 203 and the silicon nitride film 204 are determined to be within such a range as to suppress the length of the Birds' beak of an element isolation film formed by LOCOS and to prevent stresses and crystal defects accompanied by LOCOS.

A resist pattern 302 is formed on the silicon nitride film 204 in such a manner as to cover the first region 10a, the second region 10b, and the third region 10c. After that, the silicon nitride film 204, the silicon oxide film 203, and the surface layer (epitaxial layer 104) of the semiconductor substrate 10 are sequentially etched using the resist pattern 302 as a mask. In this case, the etched amount of the semiconductor substrate 10 is set to be about one-half the thickness of the element isolation film in order that the surface of the semiconductor substrate 10 after formation of the element isolation film by LOCOS is flattened.

As shown in FIG. 4E, the resist pattern 302 is removed and element isolation films 205 made of silicon oxide are formed on the surface side of the semiconductor substrate 10 by LOCOS (for example, oxidation using steam at a temperature of 1000 to 1050° C.). The thickness of the element isolation film 205 is set at a value of, for example, 0.8 to 1.5 μm. The silicon nitride film 204 is then removed by wet etching using thermal phosphoric acid.

Figure 4F:
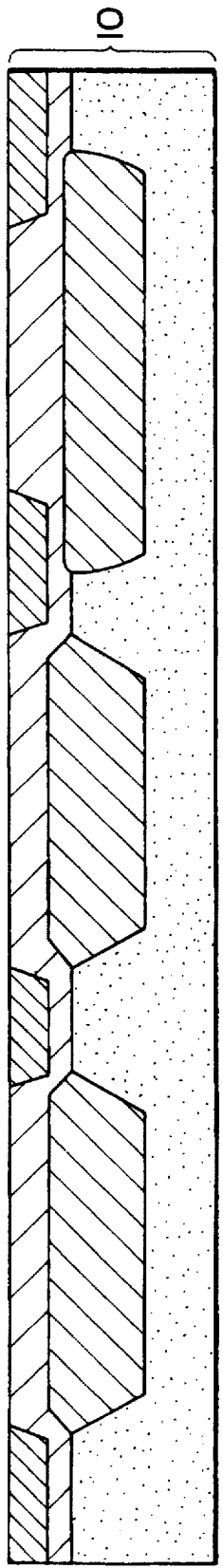

As shown in FIG. 4F, the surface of the semiconductor substrate 10 is planarized. Specifically, a silicon oxide film (not shown) is formed on the semiconductor substrate 10 to a thickness of about 100 to 600 nm by CVD and a resist film is applied on the upper surface of the silicon oxide film, and the surface of the semiconductor substrate 10 is etched-back from the upper surface side of the resist film by RIE (Reactive Ion Etching) until it is planarized. A silicon oxide film (not shown) having a thickness of about 10 to 30 nm is then formed on the semiconductor substrate 10 by thermal oxidation (900° C.).

Figure 4G:
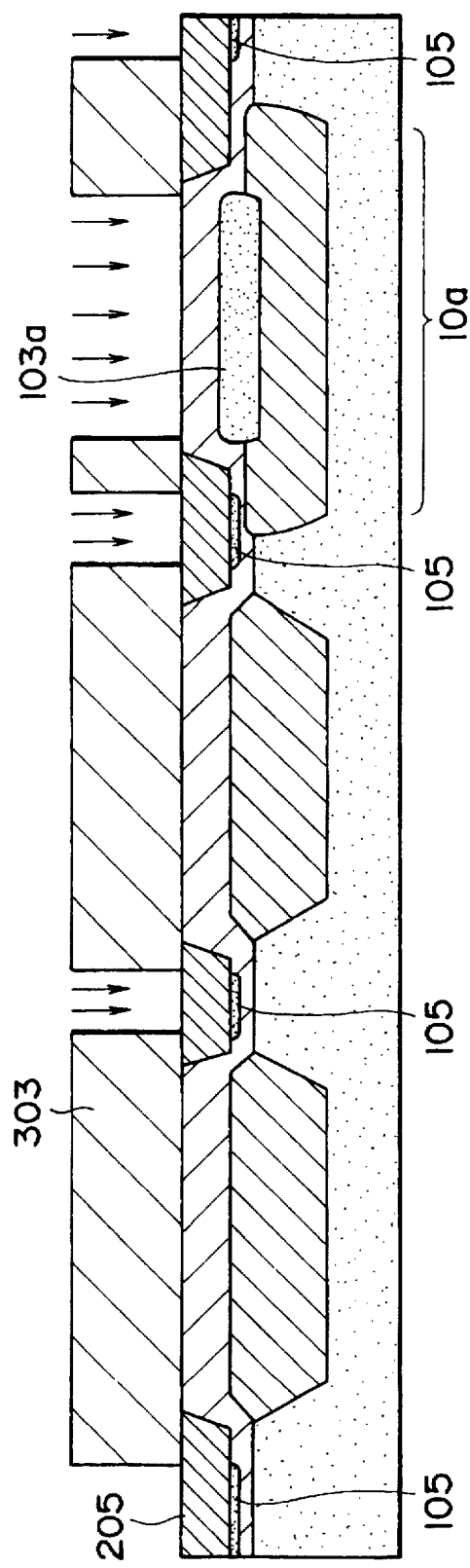

Next, as shown in FIG. 4G, a resist pattern 303 having opening portions positioned over the central portions of the element isolation films 205 and over the first region 10a is formed on the semiconductor substrate 10. Then, a P-type impurity is doped by ion implantation using the resist pattern 303 as a mask to form isolation portions 105 under the element isolation films 205 and a buried collector 103a of the No. 1 Tr in the first region 10a. Here, ions of boron (B+) as the P-type impurity are doped at an implantation energy of about 200 to 500 keV at a dose of about $10^{13}$ to $10^{14}$ ions/cm$^2$.

The above-described processing sequence, in which the surface side of the semiconductor substrate 10 has been thus isolated into the first, second, and third regions 10a, 10b and 10c by the element isolation films 205 and the isolation portions 105, is followed by the characteristic processing sequence of the present invention. Hereinafter, the processing sequence of each embodiment following on the above-described preliminary processing sequence will be described.

FIGS. 1A to 1H are process diagrams illustrating a first embodiment of a process of fabricating a semiconductor device of the present invention. Now, the first embodiment will be described with reference to these figures.

First, prior to carrying out the first embodiment, after the silicon nitride film 204 is removed as described with reference to FIG. 4E and before the silicon oxide film is formed for planarization of the surface of the semiconductor substrate 10 as described with reference to FIG. 4F in the preliminary processing sequence, an impurity is doped for forming collector contact portions 106b, 106c on the surface side of the semiconductor substrate 10 at the second and third regions 10b and 10c respectively. After that, the silicon oxide film for planarizing the surface of the semiconductor substrate 10 is formed, followed by activation of the above impurity by heat treatment. Thus, a No. 2 Tr collector contact portion 106b and a No. 3 Tr collector contact portion 106c are formed on the surface side of the second and third regions 10b and 10c, respectively.

Next, in the processing sequence of the first embodiment following on the above-described preliminary processing sequence, after removal of the resist pattern 303 shown in FIG. 4G, a resist pattern 304 having opening portions positioned over a No. 1 Tr base contact portion forming region in the first region 10a and over a No. 2 Tr emitter forming region in the second region 10b is formed on the semiconductor substrate 10 as shown in FIG. 1A. An N-type impurity is doped in the second region 10b for forming an emitter 107b and also in the first region 10a for forming a base contact portion 108a by ion implantation using the resist pattern 304 as a mask. Here, ions of arsenic (As+) as the N-type impurity are doped at an implantation energy of about 30 to 70 keV in a dose of about $10^{15}$ to $10^{16}$ ions/cm$^2$.

As shown in FIG. 1B, after removal of the resist pattern 304, a resist pattern (not shown) having an opening portion positioned over a No. 1 Tr base forming region in the first region 10a is formed on the semiconductor substrate 10. Next, an N-type impurity is doped in the first region 10a for forming a base 109a by ion implantation using the resist as a mask. Here, ions of phosphorus (P+) as the N-type impurity are doped at an implantation energy of about 150 to 300 keV in a dose of about $10^{13}$ to $10^{14}$/cm$^2$.

After removal of the resist pattern, a resist pattern 305 having an opening portion positioned over a No. 2 Tr base forming region in the second region 10b is formed on the semiconductor substrate 10. Next, a P-type impurity is doped in the second region 10b for forming a base 109b by ion implantation using the resist pattern 305 as a mask. Here, ions of boron (B+) as the P-type impurity are doped at an implantation energy of about 20 to 70 keV at a dose of about $10^{13}$ to $10^{14}$ ions/cm$^2$.

Accordingly, in this embodiment, only the above steps of forming the bases 109a, 109b are added to the related art processing sequence of forming an NPN Tr of a double polysilicon structure and PNP Trs of a single polysilicon structure on the same semiconductor substrate. In addition, the two ion implantation steps described with reference to FIG. 1B may be performed in the manner reversed as described above.

Figure 1C:
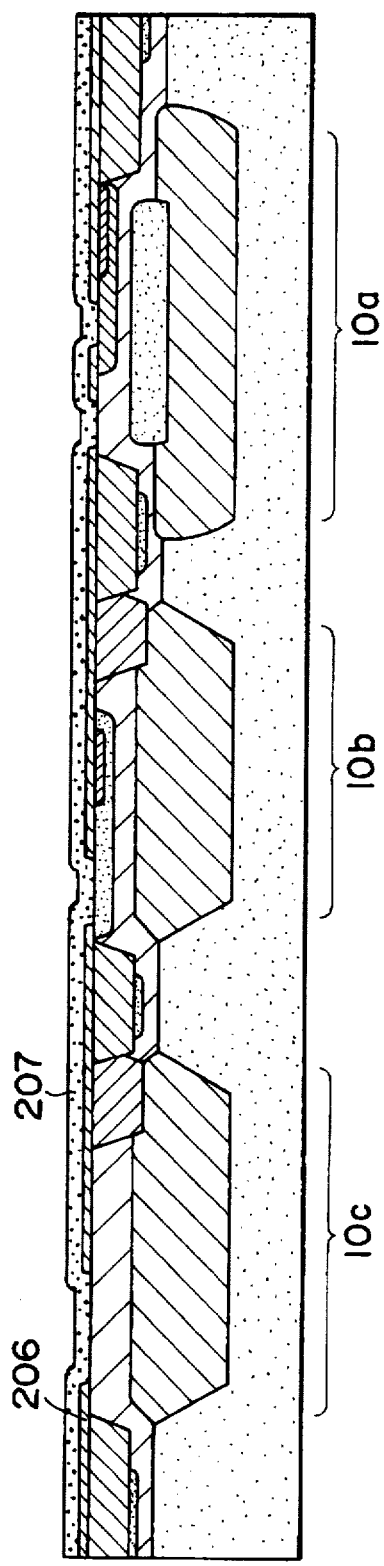

After removal of the resist pattern 305, a silicon oxide film 206 having a thickness of about 50 to 100 nm is formed by CVD as shown in FIG. 1C. Next, the silicon oxide film 206 is removed by etching at areas positioned over an No. 1 Tr emitter forming region and a No.1 collector contact portion forming region in the first region 10a, a No. 2 Tr base contact portion forming region in the second region 10b, and an emitter/base contact portion forming region in the third region 10c. Next, a first polysilicon film 207 is formed on the semiconductor substrate 10 in such a manner as to cover the silicon oxide film 206 by CVD, and a P-type impurity is doped in the first polysilicon film 207 by ion implantation. Here, ions of boron difluoride (BF$_2^+$) as the P-type impurity are doped at an implantation energy of 30 to 70 keV in a dose of about $10^{15}$ to $10^{16}$ ions/cm$^2$. In addition, the polysilicon film containing boron (P-type impurity) may be formed in the above step.

Figure 1D:
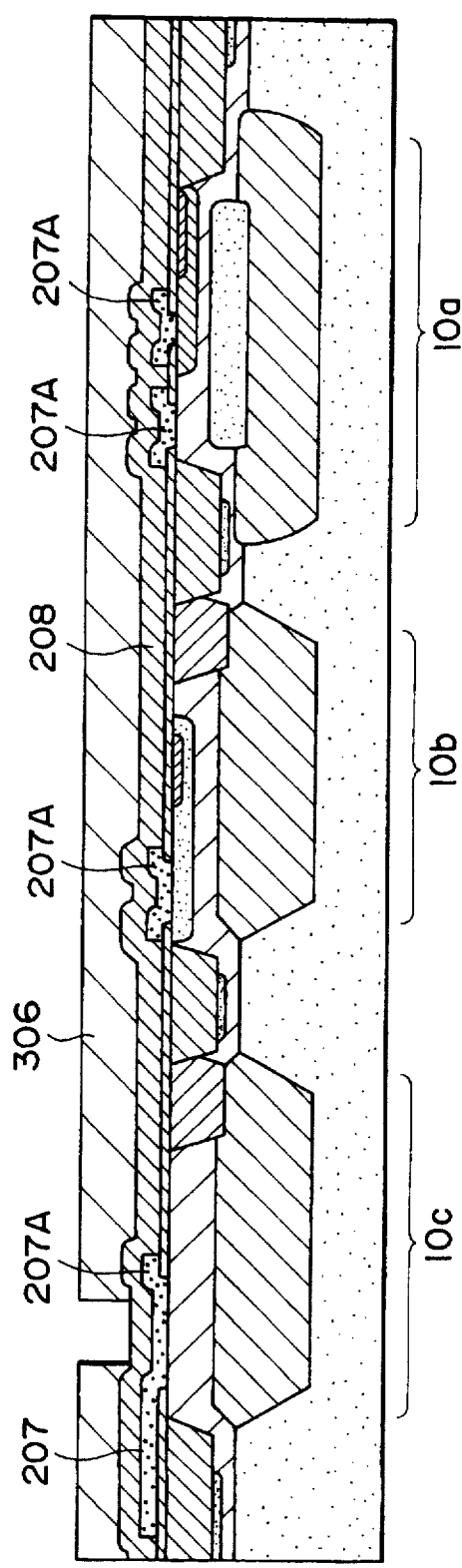

As shown in FIG. 1D, by patterning the first polysilicon film 207, polysilicon electrodes 207A made of the first polysilicon film 207 are formed at positions over the emitter forming region and the collector contact portion forming region in the first region 10a, the base contact portion forming region in the second region 10b, and the emitter/base contact portion forming region in the third region 10c. After that, a silicon oxide film 208 is formed by CVD, and a resist pattern 306 having an opening portion positioned over the emitter forming region in the third region 10c is formed on the silicon oxide film 208.

Figure 1E:
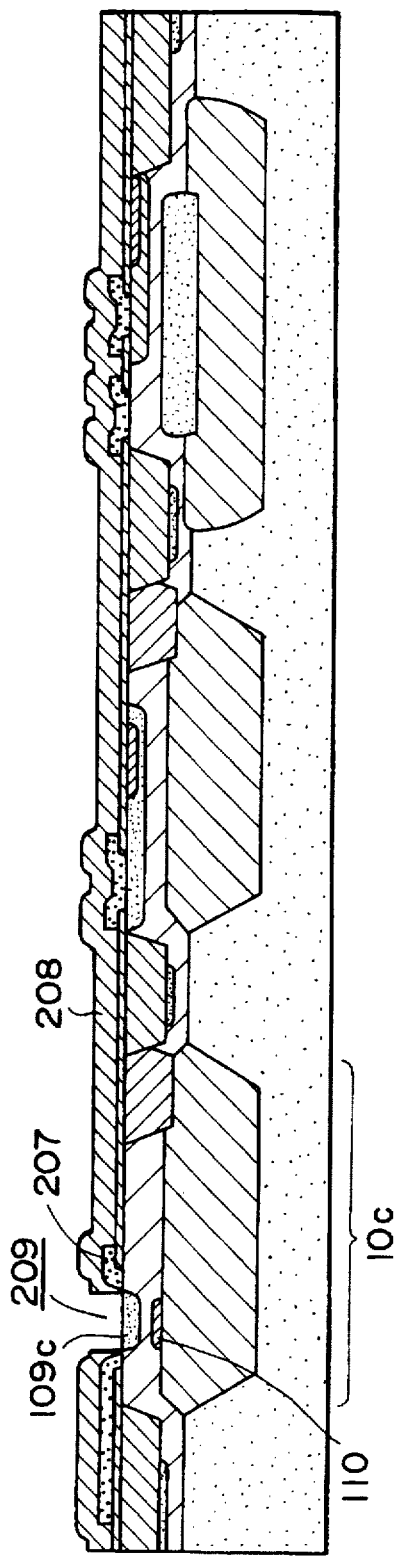

As shown in FIG. 1E, the silicon oxide film 208 and the first polysilicon film 207 are etched by RIE using the resist pattern 306 as a mask, to form a contact hole 209 reaching the emitter forming region in the semiconductor substrate 10 at the third region 10c. Here, for example, oxygen (O$_2$) and trifluoromethane (CHF$_3$) are used as the etching gas for etching the silicon oxide film 208, and trifluorotrichloroethane (C$_2$C$_{13}$F$_3$) and sulfur hexafluoride (SF$_6$) are used as the etching gas for etching the first polysilicon film 207.

After removal of the resist pattern 306, an oxide film (not shown) is formed on the exposed surface of the semiconductor substrate 10 by thermal oxidation, and a P-type impurity for forming a No. 3 Tr base 109c is doped in a surface layer of the semiconductor substrate through the oxide film by ion implantation using the silicon oxide film 208 as a mask. Here, ions of boron difluoride (BF$_2^+$) as the P-type impurity are doped at an implantation energy of 30 to 70 keV in a dose of about $10^{13}$ to $10^{14}$ ions/cm$^2$. Also, in order to make faster the operational speed of the No. 3 Tr, an N-type impurity is doped under the base 109c for forming a pedestal region 110. Here, ions of phosphorus (P+) as the N-type impurity are doped at an implantation energy of 300 to 700 keV in a dose of about $10^{12}$ to $10^{13}$ ions/cm$^2$. Next, a silicon oxide film for forming a side wall (not shown) is formed to a thickness of about 300 to 600 nm by CVD.

Figure 1F:
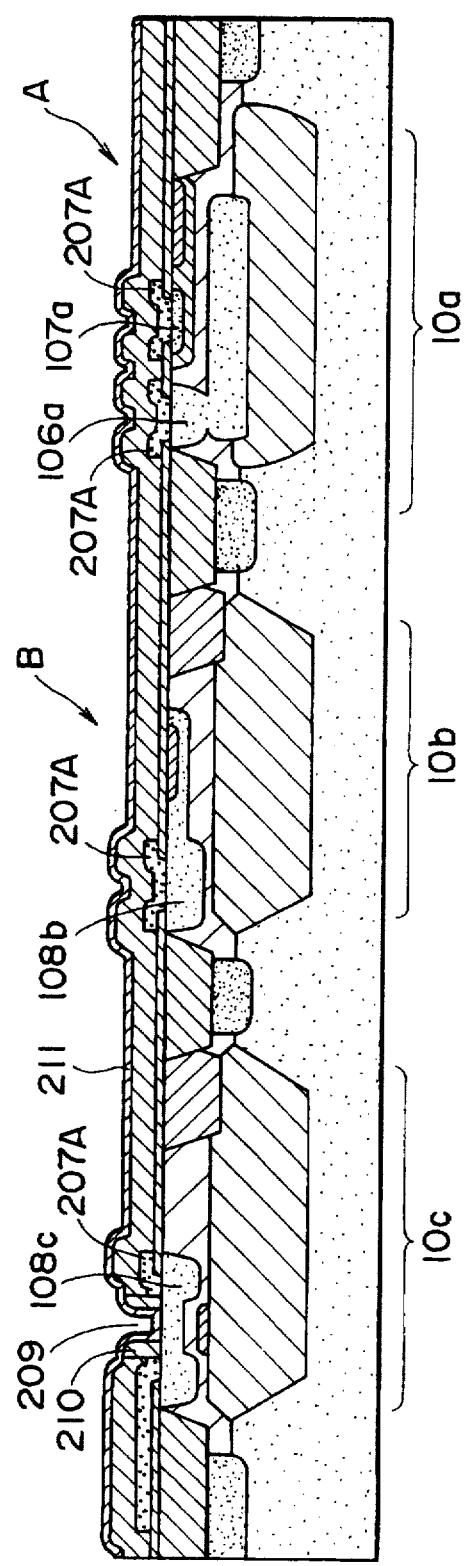

After that, as shown in FIG. 1F, the impurity diffused in the semiconductor substrate 10 is activated and also the impurity in the polysilicon electrode 207A is diffused in the semiconductor substrate 10 by heat treatment performed at a temperature of 800 to 950° C. for 10 to 60 min, to thus form a No. 1 Tr emitter 107a and a collector contact portion 106a in the first region 10a, a No. 2 Tr base contact portion 108b in the second region 10b, and a No. 3 Tr base contact potion 108c in the third region 10c. The activation regions of these impurities will be further activated by heat treatment which will be performed later.

Thus, a No. 1 TrA composed of a PNP bipolar transistor of a single polysilicon structure is formed in the first region 10a, and a No. 2 TrB composed of an NPN bipolar transistor of a single polysilicon structure is formed in the second region 10b. After that, the silicon oxide film for forming a side wall is etched-back by RIE, to form a side wall 210 made of the silicon oxide film on a side wall of the contact hole 209 of the third region 10c.

Next, a second polysilicon film 211 is formed on the semiconductor substrate 10 to a thickness of about 50 to 200 nm by CVD, and then an N-type impurity is doped in the second polysilicon film 211 by ion implantation. Here, ions of arsenic (As+) as the N-type impurity are doped at an implantation energy of 30 to 100 keV in a dose of about $10^{15}$ to $10^{16}$ ions/cm$^2$.

Next, as shown in FIG. 1G, the second polysilicon film 211 is patterned by RIE like the first polysilicon film 207, to leave the second polysilicon film 211 only at a position over an emitter forming region in the third region 10c. Thus, a polysilicon electrode 211A composed of the second polysilicon film 211 is formed. Next, a silicon oxide film 212 is formed on the semiconductor substrate 10 to a thickness of about 100 to 300 nm by CVD, and the N-type impurity in the second polysilicon film 211 is doped in the surface layer of the base 109c in the third region 10c by heat treatment, to form a No. 3 Tr emitter in the surface layer portion of the base 109c. The heat treatment is performed at a temperature of 800 to 1000° C. for several ten minutes or at a temperature of 900 to 1100° C. for several to several ten seconds. Thus, a No.3 TrC composed of an NPN bipolar transistor of a double polysilicon structure is formed in the third region 10c.

After that, as shown in FIG. 1H, contact holes 213, which reach the emitters 107a, 107b and 107c, the base contact portions 108a, 108b and 108c, and the collector contact portions 106a, 106b and 106c of the No.1 TrA, No.2 TrB and No. 3 TrC, or the polysilicon electrodes 207A, 211A connected thereto, are formed in the silicon oxide films 212, 208. Next, electrodes 214 made of a barrier metal and aluminum are formed in these contact holes 213, followed by a multi-layer interconnection forming step (not shown), to accomplish a semiconductor device 1.

FIGS. 2A to 2D are process diagrams illustrating a second embodiment of the process for fabricating a semiconductor device of the present invention. Now, the second embodiment will be described with reference to the figures.

In the second embodiment, the collector contact portions 106b, 106c are not required to be formed on the surface sides of the second and third regions 10b and 10c in the preliminary processing sequence. In the processing sequence of the second embodiment following on the preliminary processing sequence, like the steps described with reference to FIG. 1B in the first embodiment, in a semiconductor substrate 10 in which element isolation films 205, isolation portions 105 and buried collectors 103a, 103b and 103c are formed, an N-type impurity is doped in the first region 10a for forming a No. 1 Tr base 109a, and a P-type impurity is doped in the second region 10b for forming a No. 2 Tr base 109b as shown in FIG. 2A.

After that, as shown in FIG. 2B, a silicon oxide film 501 having a thickness of about 50 to 100 nm is formed by CVD. Next, the silicon oxide film 501 is removed by etching at areas over a No. 1 Tr emitter forming region, a collector portion forming region and a base contact portion forming region in the first region 10a, over a No. 2 Tr emitter forming region, a collector portion forming region and a base contact portion forming region in the second region 10b, and over an emitter/base contact portion forming region and a collector contact portion forming region in the third region 10c. A first polysilicon film 502 is then formed on the semiconductor substrate 10 in such a manner as to cover the silicon oxide film 501.

Next, a resist pattern 601 having opening portions at positions over the emitter forming region and the collector contact portion forming region in the first region 10a, over the base contact portion forming region in the second region 10b, and over the emitter/base forming region in the third region 10c is formed on the first polysilicon film 502 in such a shape as to cover the base contact portion forming region in the first region 10a, the emitter forming region and the collector contact portion forming region in the second region 10b, and the collector contact portion forming region in the third region 10c. A P-type impurity is doped in the first polysilicon film 502 by ion implantation using the resist pattern 601 as a mask. Here, ions of boron difluoride ($BF_2^+$) as the P-type impurity are doped at an implantation energy of 30 to 70 keV in a dose of about $10^{15}$ to $10^{16}$ ions/cm$^2$.

Figure 2C:
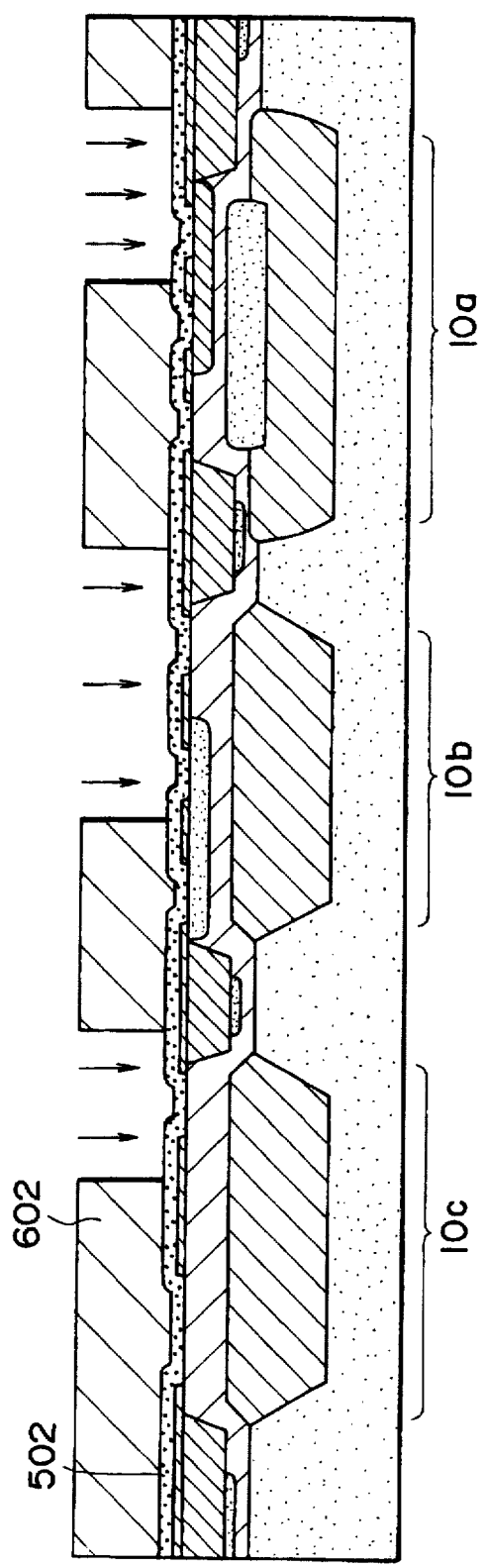

Next, after removal of the resist pattern 601, a resist pattern 602 having opening portions positioned over the base contact portion forming region in the first region 10a, over the emitter forming region and the collector contact portion forming region in the second region 10b, and over the collector contact portion forming region in the third region 10c is formed in the polysilicon film 502 as shown in FIG. 2C. After that, an N-type impurity is doped in the first polysilicon film 502 by ion implantation using the resist pattern 602 as a mask. Here, ions of phosphorus (P+) as the N-type impurity are doped at an implantation energy of 30 to 70 keV in a dose of about $10^{15}$ to $10^{16}$ ions/.

Accordingly, in this embodiment, only the ion implantation steps shown in FIGS. 2A and FIG. 2C are added to the related art processing sequence of forming an NPN Tr of a double polysilicon structure and PNP Trs of a single polysilicon structure on the same semiconductor substrate.

Figure 2D:
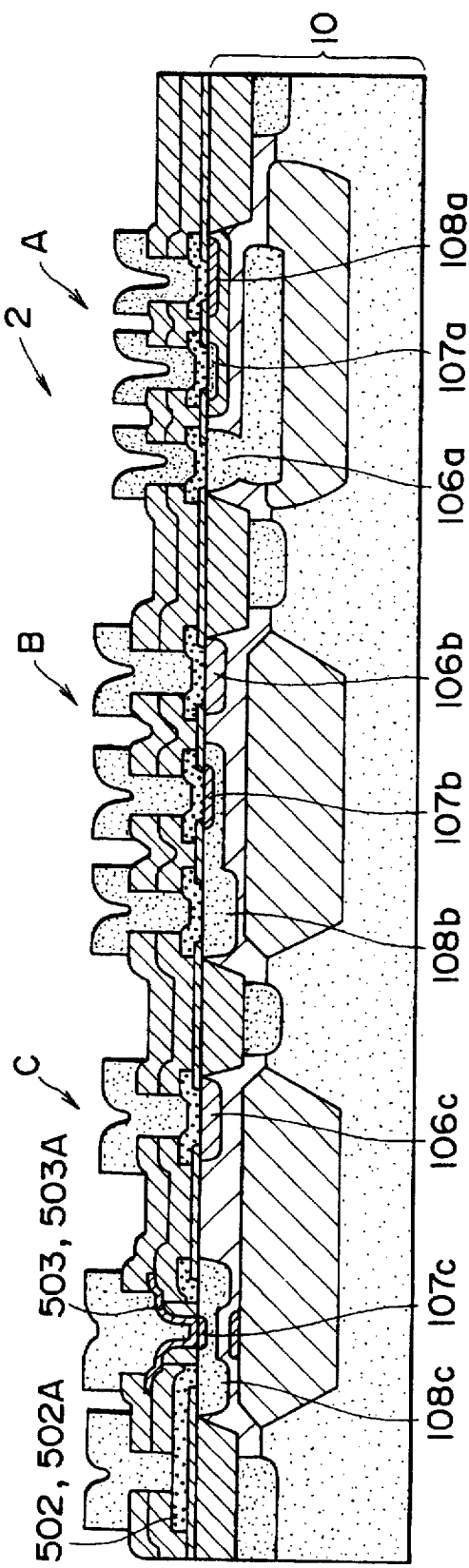

The above steps are followed by the steps described with reference to FIGS. 1D to 1H in the first embodiment. Next, as shown in FIG. 2D, the N-type impurity and the P-type impurity are diffused in a solid state from the polysilicon electrodes 502A, 503A comprised of the first polysilicon film 502 and second polysilicon film 503 into a surface layer of the semiconductor substrate 10 being in contact with the polysilicon electrodes 502A, 503A, respectively, to form emitters 107a, 107b and 107c, base contact portions 108a, 108b and 108c and collector contact portions 106a, 106b and 106c of a No. 1 TrA, No. 2 TrB and No. 3 TrC. Thus, a semiconductor device 2 is formed in which the No.1 TrA comprised of the PNP bipolar structure having a single polysilicon structure is disposed in the first region 10a; the No. 2 TrB comprised of the NPN bipolar transistor having a single polysilicon structure is disposed in the second region 10b; and the No. 3 TrC comprised of the NPN bipolar transistor having a double polysilicon structure is disposed in the third region 10c.

FIGS. 3A to 3D are process diagrams illustrating a third embodiment of the process of fabricating a semiconductor device of the present invention. Now, the third embodiment will be described with reference to these figures.

Prior to carrying out the third embodiment, as in the first embodiment, collector contact portions 106b, 106c are respectively formed on the surface side of the semiconductor substrate 10 at a second region 10b and a third region 10c in the preliminary processing sequence described with reference to FIGS. 4A to 4G.

According to the processing sequence of the third embodiment following on the above-described preliminary processing sequence, as shown in FIG. 3A, in the semiconductor substrate 10 in which element isolation films 205 and isolation portions 105 are formed and a buried collector 103a is formed in a first region 10a, an N-type impurity is doped in the first region 10a for forming a No.1 Tr base 109a and a P-type impurity is doped in the second region 10b for forming a No. 2 Tr base 109b, as in the step described with reference to FIG. 1B in the first embodiment.

After that, in the step shown in FIG. 3B, a silicon oxide film 701 having a thickness of about 50 to 100 nm is formed by CVD. Next, the silicon oxide film 701 is removed by etching at areas positioned over a No. 1 Tr emitter forming region, a collector contact portion forming region and a base contact portion forming region in the first region 10a, over a No. 2 Tr emitter forming region and a base contact portion forming region in the second region 10b, and over a No. 3 Tr emitter/base contact portion forming region in the third region 10c. Then, a first polysilicon film 702 is formed on the semiconductor substrate 10 by CVD in such a manner as to cover the silicon oxide film 701.

Next, a resist pattern 801 having opening portions positioned over the emitter forming region and collector contact portion forming region in the first region 10a, the base contact portion forming region in the second region 10b, and the emitter/base contact portion forming region in the third region 10c is formed in the first polysilicon film 702 in such a manner as to cover the base contact portion forming region in the first region 10a, the emitter forming region and collector contact portion forming region in the second region 10b. A P-type impurity is doped in the first polysilicon film 702 by ion implantation using the resist pattern 801 as a mask. Here, ions of boron difluoride ($BF_2^+$) as the P-type impurity are doped at an implantation energy of 30 to 70 keV in a dose of about $10^{15}$ to $10^{16}$ ions/.

Figure 3C:
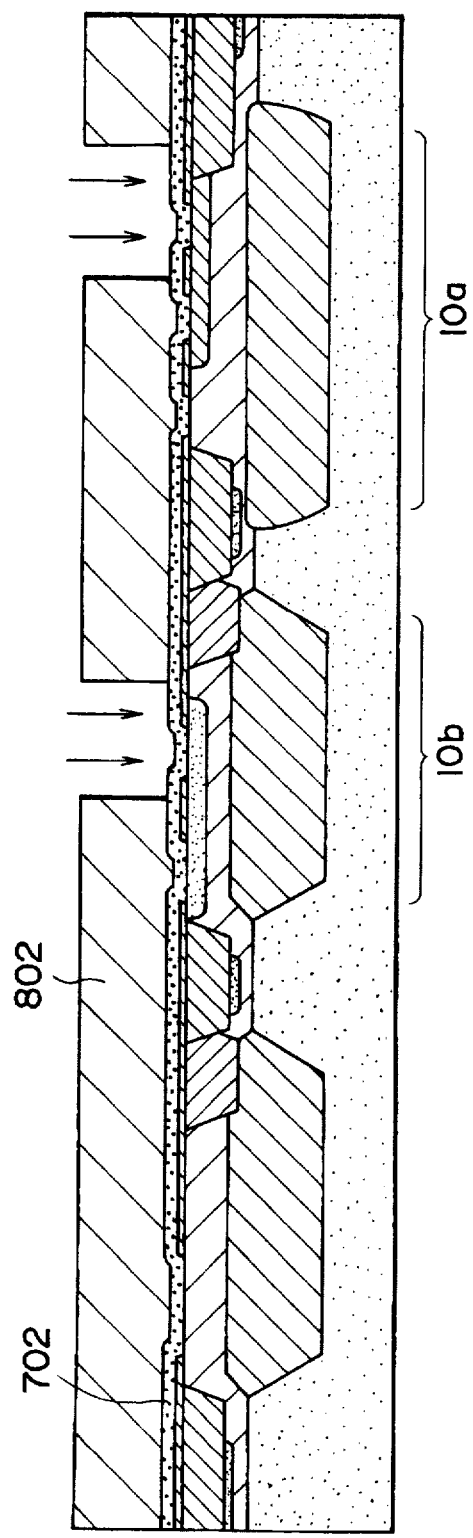

After removal of the resist pattern 801, a resist pattern 802 having opening portions positioned over the base contact portion forming region in the first region 10a and the emitter forming region in the second region 10b is formed in the first polysilicon film 702 as shown in FIG. 3C. After that, an N-type impurity is doped in the first polysilicon film 702 by ion implantation using the resist pattern 802 as a mask. Here, ions of phosphorus (P+) as the N-type impurity are doped at an implantation energy of 30 to 70 keV in a dose of about $10^{15}$ to $10^{16}$ ions/.

Accordingly, in this embodiment, only the ion implantation steps shown in FIG. 3A and 3C are added to the related art processing sequence of forming an NPN Tr of a double polysilicon structure and PNP Trs of a single polysilicon structure on the same semiconductor substrate.

Figure 3D:
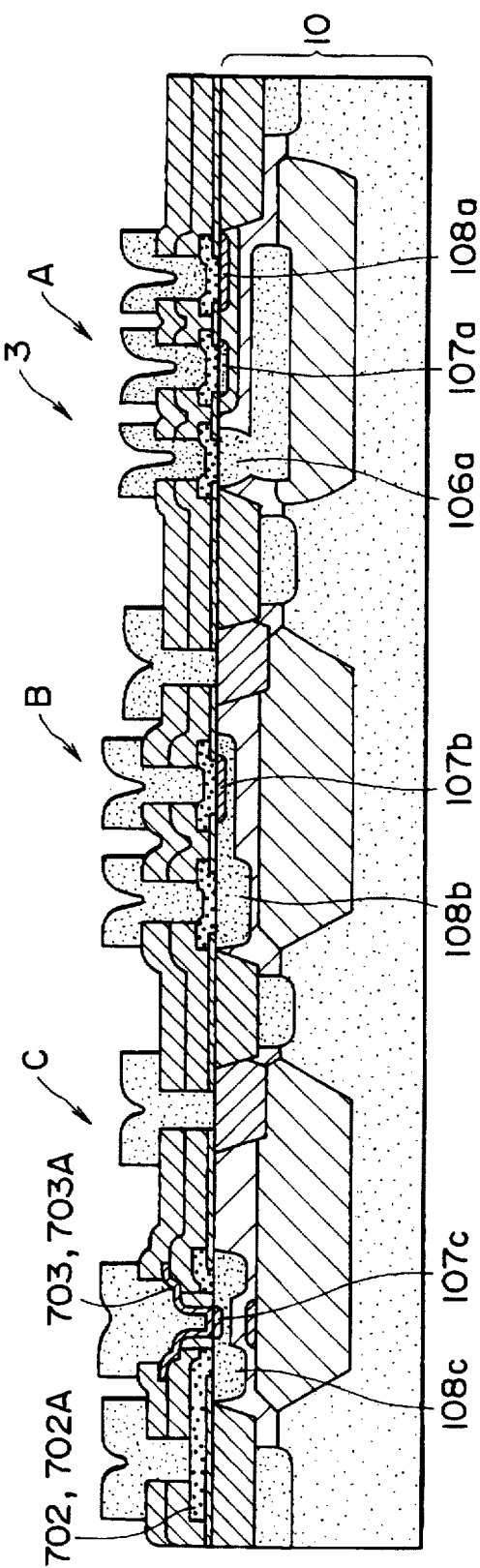

The above-described steps are followed by the steps described with reference to FIG. 1D to 1H in the first embodiment. Next, as shown in FIG. 3D, an N-type impurity and a P-type impurity are diffused in a solid state from polysilicon electrodes 702A and 703A comprised of a first polysilicon film 702 and a second polysilicon film 703 into a surface layer of the semiconductor substrate 10 being in contact with the polysilicon electrodes 702A and 703A respectively. Thus, forming form an emitter 107a, a base contact portion 108a, a collector contact portion 106a of a No.1 Tr, an emitter 107b and a base contact portions 108b of a No. 2 Tr, and an emitter 107c and a base contact portion 108c of a No.3 Tr. Thus, a semiconductor substrate 3 is formed in which a No. 1 TrA comprised of the PNP bipolar transistor of a single polysilicon structure is disposed in the first region 10a, a No.2 TrB composed of the NPN bipolar transistor of a single polysilicon structure is disposed in the second region 10b, and a No. 3 TrC composed of the NPN bipolar transistor of a double polysilicon structure is disposed in the third region 10c.

According to the embodiment of the invention described above, in a process of fabricating a semiconductor device in which a first bipolar transistor and a second bipolar transistor of a conducting type opposite to that of the first bipolar transistor are disposed in the same semiconductor substrate, characterized in that a base contact portion of the first bipolar transistor and an emitter of the second bipolar transistor are formed in the same step, and an emitter of the first bipolar transistor and a base contact portion of the second bipolar transistor are formed in the same step. Accordingly, it is possible to form the above semiconductor device only by adding the step of forming bases and the step of collectors to steps of fabricating semiconductor devices composed of bipolar transistors of a single polysilicon structure and of the same conducting type and a semiconductor device composed of a bipolar transistor of a double polysilicon structure, and hence to simplify the process of fabricating a semiconductor device having a complementary circuit.

The present invention is subject to many variations. modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. A process of fabricating a semiconductor device in which a first bipolar transistor having a single polysilicon structure, a second bipolar transistor having a single polysilicon structure and being of a conducting type opposite to that of said first bipolar transistor, and a third bipolar transistor having a double polysilicon structure are provided in the same semiconductor substrate, said method comprising the steps of:

forming a base contact portion of said first bipolar transistor and an emitter of said second bipolar transistor in a first same step;

forming an emitter of said first bipolar transistor, a base contact portion of said second bipolar transistor and a base contact portion of said third bipolar transistor are in a second same step; and forming a collector of said second bipolar transistor and a collector of said third bipolar transistor in a third same step.

2. A process of fabricating a semiconductor device according to claim 1, wherein a collector contact portion of said first bipolar transistor is formed together with the emitter of said first bipolar transistor and the base contact portions of said second bipolar transistor and said third bipolar transistor in the second same step.

3. A process of fabricating a semiconductor device according to claim 1, wherein the first and third same manufacturing steps occur in a single manufacturing step.

* * * * *